(12) United States Patent
Losehand et al.

(10) Patent No.: US 6,191,015 B1
(45) Date of Patent: Feb. 20, 2001

(54) METHOD FOR PRODUCING A SCHOTTKY DIODE ASSEMBLY FORMED ON A SEMICONDUCTOR SUBSTRATE

(75) Inventors: Reinhard Losehand; Hubert Werthmann, both of München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/313,419

(22) Filed: May 17, 1999

Related U.S. Application Data

(62) Division of application No. 08/845,757, filed on Apr. 25, 1997, now Pat. No. 5,907,179.

(30) Foreign Application Priority Data

Apr. 25, 1996 (DE) .............................................. 196 16 605

(51) Int. Cl.[7] .............................. H01L 21/28; H01L 21/44
(52) U.S. Cl. ............................................ 438/570; 438/92
(58) Field of Search ................................... 257/109, 471, 257/474, 475, 478, 483, 484; 438/92, 167, 379, 570

(56) References Cited

U.S. PATENT DOCUMENTS

| | | | |
|---|---|---|---|
| 4,062,033 | * 12/1977 | Suzuki | 257/474 |
| 4,373,166 | * 2/1983 | Bergeron | 257/475 |
| 4,638,551 | 1/1987 | Einthoven | 438/530 |
| 4,816,879 | 3/1989 | Ellwanger | 257/486 |
| 5,311,042 | * 5/1994 | Anceau | 257/173 |
| 5,539,237 | 7/1996 | Todd et al. | 257/484 |
| 5,612,568 | * 3/1997 | Arai | 257/481 |
| 5,614,755 | 3/1997 | Hutter et al. | 257/471 |

FOREIGN PATENT DOCUMENTS

| | | |
|---|---|---|
| 31 24 572 A1 | 12/1982 | (DE) . |
| 36 44 253 A1 | 6/1987 | (DE) . |
| 32 06 608 C2 | 12/1988 | (DE) . |
| 0 129 362 A2 | 12/1984 | (EP) . |

OTHER PUBLICATIONS

Patent Abstracts of Japan No. 06–252381 (Hideaki), dated Sep. 9, 1994.
Patent Abstracts of Japan No. 06–268245 (Junji), dated Sep. 22, 1994.
Patent Abstracts of Japan No. 62–281367 (Yasuo), dated Dec. 7, 1987.

* cited by examiner

Primary Examiner—Olik Chaudhuri
Assistant Examiner—Hoai Pham
(74) Attorney, Agent, or Firm—Herbert L. Lerner; Laurence A. Greenberg; Werner H. Stemer

(57) ABSTRACT

A Schottky diode assembly includes a Schottky contact formed on a semiconductor substrate and having a semiconductor region of a first conduction type, a metal layer disposed adjacently on the semiconductor region, a protective structure constructed on a peripheral region of the Schottky contact and a doped region in the semiconductor substrate having a second conduction type of opposite polarity from the first conduction type. The doped region extends from a main surface of the semiconductor substrate to a predetermined depth into the semiconductor substrate. The doped region of the protective structure has at least two different first and second doped portions located one below the other relative to the main surface of the semiconductor substrate. The first doped portion is at a greater depth and has a comparatively lesser doping, and the second doped portion has a comparatively higher doping and a slight depth adjacent the main surface of the semiconductor substrate.

10 Claims, 1 Drawing Sheet

METHOD FOR PRODUCING A SCHOTTKY DIODE ASSEMBLY FORMED ON A SEMICONDUCTOR SUBSTRATE

CROSS-REFERENCE TO RELATED APPLICATION

This application is a divisional of application Ser. No. 08/845,757, filed on Apr. 25, 1997, now U.S. Pat. No. 5,907,179.

BACKGROUND OF THE INVENTION

Field of the Invention

The invention relates to a Schottky diode assembly including a Schottky contact formed on a semiconductor substrate and having a semiconductor region of a first conductivity type, a metal layer disposed adjacently on the semiconductor region, a protective structure constructed on a peripheral region of the Schottky contact, and a doped region constructed in the semiconductor substrate and having a second conductivity type of opposite polarity from the first conductivity type, the doped region extending from a main surface of the semiconductor substrate to a predetermined depth into the semiconductor substrate. The invention also relates to a method for producing such a Schottky diode assembly.

In order to improve the depletion properties of a Schottky diode, it is known to diffuse a guard ring, of opposite conductivity to the semiconductor region of the diode, at the peripheral region of the metal-to-substrate junction. That produces a graduated p-n junction at the diode edge, so that leakage currents can be reduced. In the case of an n-doped silicon epitaxial layer for the diode semiconductor region, the guard ring is p-type conductivity. As a result of that provision it is possible to successfully adjust the depletion currents of a Schottky diode uniformly over the production of the diode and at the lowest level for a particular diode type. In order to optimize the breakdown voltage for a predetermined diode type, the doping of the guard ring should be as low as possible and diffused as deeply as possible, yet should be located above the level of the epitaxial doping so that the p-n junction is effective. However, low doping of the guard ring at the boundary surface with the dielectric disposed adjacent the metal-to-substrate contact increases the danger of channeling at that boundary surface, which results in an increase in the depletion current of the diode and the capacitance.

Summary of the Invention

It is accordingly an object of the invention to provide a Schottky diode assembly and a production method, which overcome the hereinafore-mentioned disadvantages of the heretofore-known devices and methods of this general type and which improve a guard ring in a Schottky diode in such a way that the breakdown behavior of the diode is improved and at the same time the danger of channeling at a boundary surface with the dielectric of the guard ring can be effectively prevented.

With the foregoing and other objects in view there is provided, in accordance with the invention, a Schottky diode assembly, comprising a semiconductor substrate having a main surface, a semiconductor region of a first conductivity type and a metal layer disposed adjacently on the semiconductor region; and a Schottky contact disposed on the semiconductor substrate; the Schottky contact having a peripheral region, a protective structure on the peripheral region, the protective structure having a doped region in the semiconductor substrate with a second conductivity type of opposite polarity from the first conductivity type, the doped region extending from the main surface to a predetermined depth into the semiconductor substrate, the doped region having at least two different first and second doped portions disposed one below the other relative to the main surface, the first doped portion having a greater depth and a comparatively lesser doping, and the second doped portion having a comparatively higher doping and a lesser depth adjacent the main surface.

In accordance with another feature of the invention, the first doped portion is constructed by implantation of a dopant with a comparatively low implantation dose and deep diffusion, and the second doped portion is constructed by implantation of a dopant with a comparatively high implantation dose and shallow diffusion.

The invention contemplates at least a double implantation of the guard ring. A first implantation with a low dose but deep diffusion assures good breakdown behavior of the diode, while an ensuing second implantation with a high dose but shallow diffusion suppresses the danger of the development of a channel in the guard ring. Such channel development (known as "channeling") is undesirable, since it leads to unfavorable yields as well as unstable tendencies of the diode. The high and simultaneously shallow doping in the depletion situation of the diode results in a lowering of the peak field intensity and thus overall a higher breakdown voltage of the diode. This doping is adjusted in such a way that the breakdown voltage in the guard ring is higher than in the actual Schottky diode, so that the breakdown voltage overall is determined solely by the Schottky diode.

In accordance with a further feature of the invention, the first doped portion extends to a depth of approximately one-third of the total depth of the semiconductor region of the first conductivity type, and the second doped portion extends from the main surface of the semiconductor substrate to a depth of one-fifth to one-tenth of the total thickness of the semiconductor region of the first conductivity type.

In accordance with an added feature of the invention, the total thickness of the semiconductor region of the first conductivity type is approximately 4–8 $\mu$m, the first doped portion extends to a depth of approximately 1–3 $\mu$m and the second doped portion extends to a depth of approximately 1 $\mu$m into the semiconductor substrate.

In accordance with an additional feature of the invention, the second doped portion at the main surface of the semiconductor substrate has a maximum doping of approximately $10^{19}$ N·cm$^{-3}$, and the first doped portion in a depth adjacent the second doped portion has a maximum doping of approximately $10^{17}$ N·cm$^{-3}$.

In accordance with yet another feature of the invention, the maximum doping of the second doped portion is greater by a factor of 100 than the maximum doping of the first doped portion.

In accordance with yet a further feature of the invention, the Schottky contact is radially symmetrical, and the protective structure on the peripheral region of the Schottky contact forms a guard ring.

In accordance with yet an added feature of the invention, the semiconductor substrate has silicon, and the semiconductor region is of the first conductivity type of the Schottky contact and represents an n-type conductivty epitaxial layer.

In accordance with yet an additional feature of the invention, the doped region of the protective structure is constructed by implantation of boron.

In accordance with again another feature of the invention, the Schottky contact has a breakdown voltage of approximately between 50 and 70 V.

With the objects of the invention in view, there is also provided a method for producing a Schottky diode assembly, which comprises forming a semiconductor substrate with a main surface, a semiconductor region having a first conductivity type and a metal layer disposed adjacently on the semiconductor region; forming a Schottky contact on the semiconductor substrate by providing the Schottky contact with a peripheral region, a protective structure on the peripheral region, and a doped region of the protective structure having a second conductivity type of opposite polarity from the first conductivity type and extending from the main surface to a predetermined depth into the semiconductor substrate; and forming the doped region with at least two different first and second doped portions disposed one below the other relative to the main surface by constructing the first doped portion at a greater depth and with a comparatively lesser doping and constructing the second doped portion with a comparatively higher doping and a lesser depth adjacent the main surface.

In accordance with another mode of the invention, there is provided a method which comprises forming the first doped portion by implantation of a dopant with a comparatively low implantation dose and deep diffusion, and forming the second doped portion by implantation of a dopant with a comparatively high implantation dose and shallow diffusion.

In accordance with a further mode of the invention, there is provided a method which comprises producing the first doped portion with a depth of approximately one-third of a total depth of the semiconductor region of the first conductivity type, and extending the second doped portion from the main surface of the semiconductor substrate to a depth of from one-fifth to one-tenth of the total thickness of the semiconductor region of the first conductivity type.

In accordance with an added mode of the invention, there is provided a method which comprises selecting the total thickness of the semiconductor region of the first conductivity type to be approximately 4–8 $\mu$m, producing the first doped portion with depth of approximately 1–3 $\mu$m, and extending the second doped portion to a depth of approximately 1 $\mu$m into the semiconductor substrate.

In accordance with an additional mode of the invention, there is provided a method which comprises producing the second doped portion at the main surface of the semiconductor substrate with a maximum doping of approximately $10^{19}$ N·cm$^{-3}$, and producing the first doped portion in a depth adjacent the second doped portion with a maximum doping of approximately $10^{17}$ N·cm$^{-3}$.

In accordance with yet another mode of the invention, there is provided a method which comprises producing a maximum doping of the second doped portion to be greater than a maximum doping of the first doped portion by a factor of 100.

In accordance with yet a further mode of the invention, there is provided a method which comprises constructing the Schottky contact radially symmetrically, and forming a guard ring with the protective structure on the peripheral region of the Schottky contact.

In accordance with yet an added mode of the invention, there is provided a method which comprises producing the semiconductor substrate with silicon, and representing an n-type conductivity epitaxial layer with the semiconductor region of the first conductivity type.

In accordance with yet an additional mode of the invention, there is provided a method which comprises constructing the doped region of the protective structure by implantation of boron.

In accordance with a concomitant mode of the invention, there is provided a method which comprises setting a breakdown voltage of the Schottky contact at approximately between 50 and 70 V.

Other features which are considered as characteristic for the invention are set forth in the appended claims.

Although the invention is illustrated and described herein as embodied in a Schottky diode assembly and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
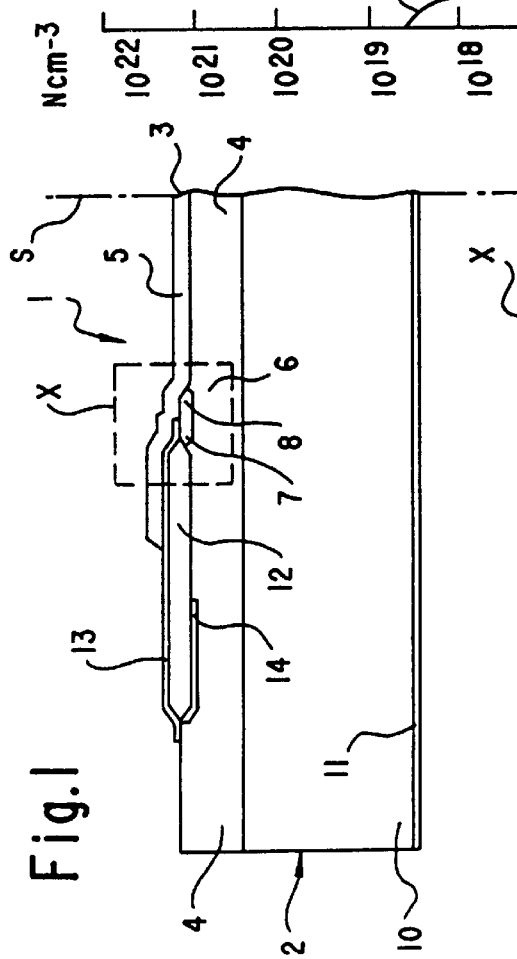
FIG. 1 is a fragmentary, diagrammatic, sectional view of a Schottky diode with a double guard ring implantation.
Figure 2:
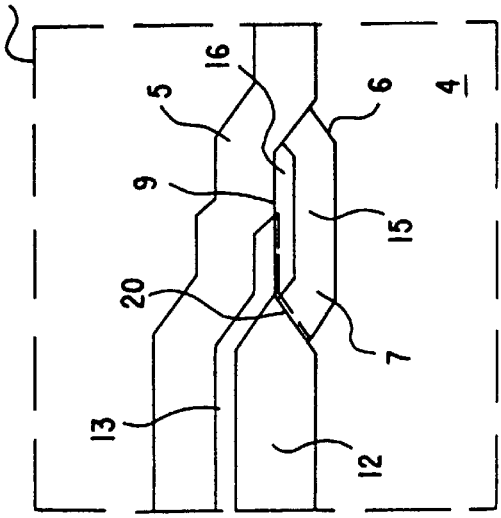
FIG. 2 is an enlarged view of a region "X" in FIG. 1.

Referring now to the figures of the drawings in detail and first, particularly, to FIGS. 1 and 2 thereof, there is seen an exemplary embodiment of a Schottky diode 1 which is constructed radially symmetrically with respect to an axis of symmetry S and has a Schottky contact 3 that is constructed on a silicon semiconductor substrate 2. The substrate 2 includes a diode semiconductor region 4 of a first conductivity type, that is an n-type conductivity silicon epitaxial layer 4 of a total thickness t in the illustrated embodiment and the substrate 2 includes a metal layer 5 disposed adjacently on the semiconductor region 4. A protective structure 7 with a doped region 8 is constructed in a peripheral region 6 of the Schottky contact 3, which has a breakdown voltage typically of 50 to 70 V. The doped region 8 is of a second conductivity type which is of opposite polarity from the first conductivity type and is of the n-type conductivity type in the case shown. The doped region 8 extends from a main surface 9 of the semiconductor substrate 2 to a predetermined depth t1 into the semiconductor substrate 2. The semiconductor substrate 2 also includes a region 10 of n+ silicon, having a rear side which may be provided with a metallizing layer 11 of gold or gold-arsenic. Reference numeral 12 indicates an SiO$_2$ region and reference numeral 13 a dielectric layer, preferably of Si$_3$N$_4$, which is deposited over the region 12. The metal layer 5 extends as far as a portion above the region 12 and the layer 13 as shown. Producing such a silicon Schottky diode with the aid of a planar technique for fabricating the Schottky contact 3 with the semiconductor region 4 and the metal layer 5 as well as the protective structure or guard ring 7, the insulation region 12 and the layer 13, is sufficiently well known to one skilled in the art and need not be described in detail herein. Reference numeral 14 indicates a channel stop implantation layer, which is disposed on the outermost peripheral region of the diode and represents an n-enrichment implantation layer that suppresses the formation of a troublesome p-channel. Since the implantation layer 4 plays no direct role in the subject of the invention and is moreover familiar to one skilled in the art, it will likewise not be described further herein.

FIG. 2 is an enlarged fragmentary view showing further details of the protective structure 7 according to the invention. The doped region 8 of the protective structure 7 has first and second doped portions 15 and 16, each of the p-type conductivity type, that are located one below the other and have different depths relative to the main surface 9 of the semiconductor substrate 2. The first doped portion 15 is constructed with a greater depth t1 and has a comparatively lesser doping, and the second doped portion 16 has a comparatively high doping and is constructed with a shallower depth t2 adjacent the main surface 9 of the semiconductor substrate 2. In the illustrated case, the total depth t of the epitaxial layer 4 is approximately 4 μm, the total depth t1 of the first doped portion 15 is approximately 2 μm and the total depth t2 of the second doped portion 16 is approximately 0.7 μm.

Figure 3:
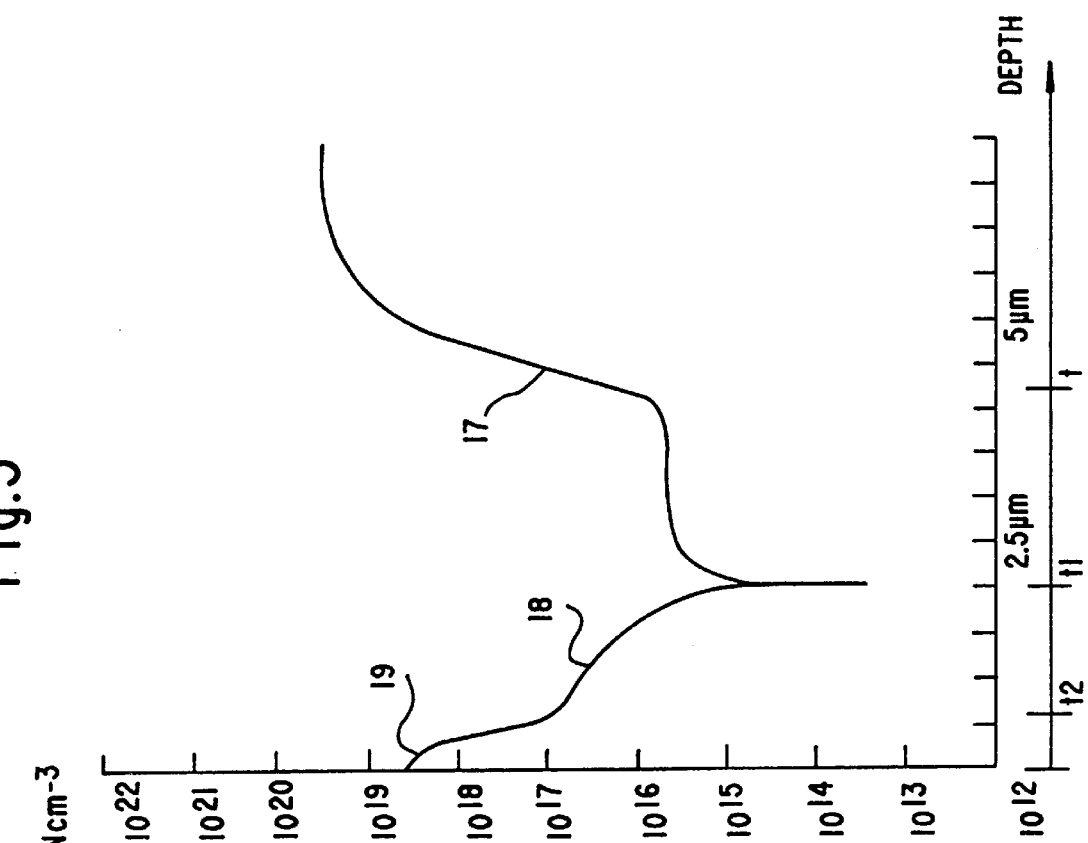
FIG. 3 is a graph of a doping profile of the guard ring.

A doping profile of the doped portions 15, 16, as well as of the epitaxial layer 4 and the remaining region 10 of the semiconductor substrate 2, can be seen in detail from the graph in FIG. 3. Specifically, the doping profile has three distinguishable curve segments 17, 18 and 19. The curve segment 17 represents the doping profile of the respective epitaxial region 4 and remaining substrate region 10 implanted with phosphorous and arsenic. The curve segment 18 shows the doping profile of the boron-implanted first doped region 8 of the protective structure 7. The curve segment 19 illustrates the doping profile of the likewise boron-implanted second doped portion 16 of the protective structure 7. The two dopings of the first and second doped portions which are to be performed successively are adjusted in such a way that the first doped portion is constructed by implantation of boron with a comparatively low implantation dose and deep diffusion, and the second doped portion is constructed by implantation of boron with a comparatively high implantation dose and shallow diffusion. It can be seen from the doping profile of FIG. 3 that the second doped portion 16 directly at the main surface 9 has a maximum doping of approximately $10^{19}$ N·cm$^{-3}$, which drops steadily with increasing depth to a value of approximately $10^{17}$ N·cm$^{-3}$, and is constructed to be relatively shallow overall. In other words, the maximum depth t2 of the second doped portion 16 is very slight, approximately to a maximum of 1 μm, as compared to the total thickness t of the epitaxial layer. The doping profile of the first doped portion 15 begins at approximately $10^{17}$ N·cm$^{-3}$ at the depth t2 and drops steadily to the depth t1. The doping profile of the first doped region assures a good breakdown behavior of the Schottky diode. At the same time, through the use of the illustrated doping profile of the second doped region, the undesired development of a channel at a boundary surface 20, shown in dashed lines in FIG. 2, with the dielectric 12 or 13 is effectively suppressed.

We claim:

1. A method for producing a Schottky diode assembly, which comprises:

forming a semiconductor substrate with a main surface, a semiconductor region having a first conductivity type and a metal layer disposed adjacently on the semiconductor region;

forming a Schottky junction between the semiconductor region having the first conductivity type and the metal layer;

providing the Schottky junction with a peripheral region, a protective structure on the peripheral region, and a doped region of the protective structure having a second conductivity type of opposite polarity from the first conductivity type and extending from the main surface to a predetermined depth into the semiconductor substrate; and forming the doped region with at least two different first and second doped portions disposed one below the other relative to the main surface by constructing the first doped portion at a greater depth and with a comparatively lesser doping and constructing the second doped portion with a comparatively higher doping and a lesser depth adjacent the main surface.

2. The method according to claim 1, which comprises forming the first doped portion by implantation of a dopant with a comparatively low implantation dose and deep diffusion, and forming the second doped portion by implantation of a dopant with a comparatively high implantation dose and shallow diffusion.

3. The method according to claim 1, which comprises producing the first doped portion with a depth of approximately one-third of a total depth of the semiconductor region of the first conductivity type, and extending the second doped portion from the main surface of the semiconductor substrate to a depth of from one-fifth to one-tenth of the total thickness of the semiconductor region of the first conductivity type.

4. The method according to claim 3, which comprises selecting the total thickness of the semiconductor region of the first conductivity type to be approximately 4–8 μm, producing the first doped portion with depth of approximately 1–3 μm, and extending the second doped portion to a depth of approximately 1 μm into the semiconductor substrate.

5. The method according to claim 1, which comprises producing the second doped portion at the main surface of the semiconductor substrate with a maximum doping of approximately $10^{19}$ N·cm$^{-3}$, and producing the first doped portion in a depth adjacent the second doped portion with a maximum doping of approximately $10^{17}$ N·cm$^{-3}$.

6. The method according to claim 1, which comprises producing a maximum doping of the second doped portion to be greater than a maximum doping of the first doped portion by a factor of 100.

7. The method according to claim 1, which comprises constructing the Schottky contact radially symmetrically, and forming a guard ring with the protective structure on the peripheral region of the Schottky contact.

8. The method according to claim 1, which comprises producing the semiconductor substrate with silicon, and representing an n-type conductivity epitaxial layer with the semiconductor region of the first conductivity type.

9. The method according to claim 1, which comprises constructing the doped region of the protective structure by implantation of boron.

10. The method according to claim 1, which comprises setting a breakdown voltage of the Schottky contact at approximately between 50 and 70 V.

* * * * *